US009575204B2

(12) United States Patent
Chen et al.

(10) Patent No.: US 9,575,204 B2
(45) Date of Patent: Feb. 21, 2017

(54) NUCLEAR MAGNETIC RESONANCE LOGGING TOOL HAVING MULTIPLE PAD-MOUNTED ATOMIC MAGNETOMETERS

(75) Inventors: Songhua Chen, Katy, TX (US); Ron Charles Balliet, Houston, TX (US)

(73) Assignee: HALLIBURTON ENERGY SERVICES, INC., Houston, TX (US)

( * ) Notice: Subject to any disclaimer, the term of this patent is extended or adjusted under 35 U.S.C. 154(b) by 145 days.

(21) Appl. No.: 14/377,813

(22) PCT Filed: Feb. 8, 2012

(86) PCT No.: PCT/US2012/024305
§ 371 (c)(1),
(2), (4) Date: Aug. 8, 2014

(87) PCT Pub. No.: WO2013/119222
PCT Pub. Date: Aug. 15, 2013

(65) Prior Publication Data
US 2015/0054503 A1 Feb. 26, 2015

(51) Int. Cl.
*G01V 3/00* (2006.01)
*G01V 3/32* (2006.01)
*E21B 17/10* (2006.01)
*G01R 33/483* (2006.01)
*G01R 33/26* (2006.01)

(52) U.S. Cl.
CPC .............. *G01V 3/32* (2013.01); *E21B 17/1021* (2013.01); *G01R 33/4831* (2013.01); *G01R 33/26* (2013.01)

(58) Field of Classification Search
CPC ........................................................ G01V 3/32

USPC ........................................ 324/303, 300, 314
See application file for complete search history.

(56) References Cited

U.S. PATENT DOCUMENTS

| 4,710,713 A | 12/1987 | Strikman |
| 4,717,876 A | 1/1988 | Masi et al. |
| 4,717,877 A | 1/1988 | Taicher |
| 4,939,648 A | 7/1990 | O'Neill |

(Continued)

FOREIGN PATENT DOCUMENTS

| GB | 2374102 | 10/2002 |
| WO | WO-2013/119222 | 8/2013 |

OTHER PUBLICATIONS

AU Examination Report No. 1, dated Sep. 16, 2014, Appl. No. 2012369222, "Nuclear Magnetic Resonance Logging Tool Having Multiple Pad-Mounted Atomic Magnetometers," Filed Feb. 8, 2012, 3 pgs.

(Continued)

*Primary Examiner* — Louis Arana
(74) *Attorney, Agent, or Firm* — Iselin Law PLLC; Benjamin Fite

(57) ABSTRACT

Various disclosed nuclear magnetic resonance (NMR) logging systems and methods employ a plurality of NMR sensors, including atomic magnetometers, mounted on pads. Certain method embodiments include: utilizing the Earth magnetic field to pre-polarize the protons in a formation; utilizing a plurality of atomic magnetometers to obtain NMR measurements; and determining at least one characteristic relaxation time of the formation. The NMR sensor may optionally include a permanent magnet assembly.

22 Claims, 3 Drawing Sheets

(56) References Cited

U.S. PATENT DOCUMENTS

| | | | |
|---|---|---|---|
| 4,987,368 A * | 1/1991 | Vinegar | G01V 3/32 324/303 |
| 5,055,787 A | 10/1991 | Kleinberg et al. | |
| 5,280,243 A | 1/1994 | Miller | |
| 5,309,098 A | 5/1994 | Coates | |
| 5,376,884 A | 12/1994 | Sezginer | |
| 5,432,446 A * | 7/1995 | MacInnis | G01V 3/32 324/303 |
| 5,517,115 A | 5/1996 | Prammer | |
| 5,557,200 A | 9/1996 | Coates | |
| 5,696,448 A | 12/1997 | Coates et al. | |
| 5,936,405 A | 8/1999 | Prammer | |
| 6,005,389 A | 12/1999 | Prammer | |
| 6,018,243 A | 1/2000 | Taicher et al. | |
| 6,023,164 A | 2/2000 | Prammer | |
| 6,107,796 A | 8/2000 | Prammer | |
| 6,111,408 A | 8/2000 | Blades et al. | |
| 6,242,913 B1 | 6/2001 | Prammer | |
| 6,255,819 B1 | 7/2001 | Day et al. | |
| 6,489,872 B1 | 12/2002 | Fukushima et al. | |
| 6,512,371 B2 | 1/2003 | Prammer | |
| 6,518,758 B1 | 2/2003 | Speier et al. | |
| 6,525,534 B2 | 2/2003 | Akkurt et al. | |
| 6,534,980 B2 | 3/2003 | Toufaily et al. | |
| 6,541,969 B2 | 4/2003 | Sigal et al. | |
| 6,577,125 B2 | 6/2003 | Prammer et al. | |
| 6,583,621 B2 | 6/2003 | Prammer et al. | |
| 6,646,437 B1 | 11/2003 | Chitale et al. | |
| 6,717,404 B2 | 4/2004 | Prammer | |
| 7,012,428 B1 | 3/2006 | Ward et al. | |
| 7,463,027 B2 | 12/2008 | Prammer et al. | |
| 8,373,412 B2 * | 2/2013 | Kruspe | G01V 3/32 324/303 |
| 2004/0090230 A1 | 5/2004 | Appel et al. | |
| 2006/0097722 A1 | 5/2006 | Scheven | |
| 2008/0128166 A1 | 6/2008 | Forgang et al. | |
| 2008/0221800 A1 | 9/2008 | Gladkikh et al. | |
| 2009/0025982 A1 | 1/2009 | Hall et al. | |
| 2010/0264915 A1 | 10/2010 | Saldungaray et al. | |

OTHER PUBLICATIONS

EP Extended Search Report, dated May 27, 2015, Appl No. PCT/US2012/024305, "Nuclear Magnetic Resonance Logging Tool Having Multiple Pad-Mounted Atomic Magnetometers," Filed Feb. 8, 2012, 6 pgs.

Savukov, I M., et al., "Detection of NMR signals with a radio-frequency atomic magnetometer," Journal of Magnetic Resonance, 2007, pp. 214-220, vol. 185.

PCT International Search Report and Written Opinion, dated Jun. 8, 2012, Appl No. PCT/US2012/024305, "Nuclear Magentic Resonance Logging Tool Having Multiple Pad-Mounted Atomic Magnetometers", filed Feb. 8, 2012, 9 pgs.

PCT International Preliminary Report on Patentability, dated Feb. 24, 2014, Appl No. PCT/US2012/024305, "Nuclear Magentic Resonance Logging Tool Having Multiple Pad-Mounted Atomic Magnetometers", filed Feb. 8, 2012, 4 pgs.

* cited by examiner

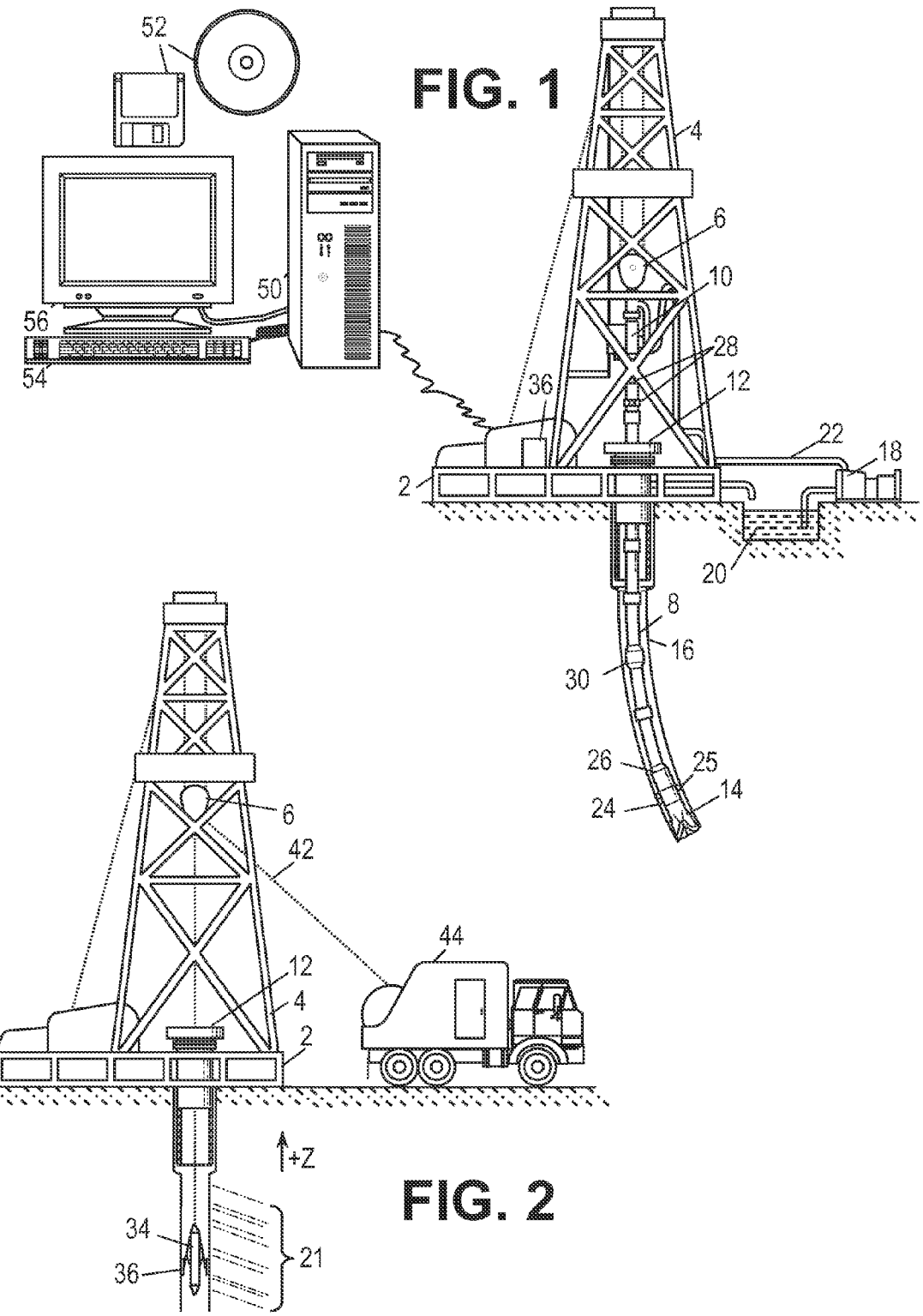

NUCLEAR MAGNETIC RESONANCE LOGGING TOOL HAVING MULTIPLE PAD-MOUNTED ATOMIC MAGNETOMETERS

BACKGROUND

Modern oil field operators demand access to a great quantity of information regarding the parameters and conditions encountered downhole. Such information typically includes characteristics of the earth formations traversed by the borehole and data relating to the size and configuration of the borehole itself. The collection of information relating to conditions downhole, which commonly is referred to as "logging," can be performed by several methods including wireline logging, tubing-conveyed logging, and "logging while drilling" ("LWD").

In wireline logging, a sonde is lowered into the borehole after some or all of the well has been drilled. The sonde hangs at the end of a long cable or "wireline" that provides mechanical support to the sonde and also provides an electrical connection between the sonde and electrical equipment located at the surface of the well. In accordance with existing logging techniques, various parameters of the earth's formations are measured and correlated with the position of the sonde in the borehole as the sonde is pulled uphole.

Tubing-conveyed logging is similar to wireline logging, but the sonde is mounted on the end of a tubing string. The rigid nature of the tubing string enables the tubing-conveyed sonde to travel where it would be difficult to send a wireline sonde, e.g., along horizontal or upwardly-inclined sections of the borehole. The tubing string can include embedded conductors in the tubing wall for transporting power and telemetry, or a wireline cable can be fed through the interior of the tubing string, or the sonde can simply store data in memory for later retrieval when the sonde returns to the surface.

In LWD, the drilling assembly includes sensing instruments that measure various parameters as the formation is being drilled, thereby enabling measurements of the formation while it is less affected by fluid invasion. While LWD measurements are desirable, drilling operations create an environment that is generally hostile to electronic instrumentation, telemetry, and sensor operations.

One of the instruments that has been employed in at least the LWD and wireline logging environments is a nuclear magnetic resonance ("NMR") logging tool. NMR tools operate by using an imposed static magnetic field, $B_0$, to preferentially polarize the nuclear spins of the formation nuclei parallel to the imposed field. The nuclei converge to their equilibrium alignment at a measurable rate. When this convergence occurs after the nuclei have been placed in a cooperative initial state (discussed below), it is known as magnetization recovery, or simply, recovery. The time constant for recovery is called the "spin-lattice" or "longitudinal" relaxation time $T_1$.

During or after the polarization period, the tool applies a perturbing field. Usually the perturbing field takes the form of a radio frequency ("RF") pulse whose magnetic component, $B_1$, is perpendicular to the static field $B_0$. This perturbing field moves the preferential orientation of the nuclei into the transverse plane. The frequency of the pulse can be chosen to target specific nuclei (e.g., hydrogen). The polarized nuclei are perturbed simultaneously and, when the perturbation ends, they precess around the static magnetic field gradually returning to alignment with the static field once again. As previously mentioned, the rate at which the nuclei recover their initial alignment is governed by the "longitudinal" relaxation time constant $T_1$. There is a second time constant to this process which can also be measured, and that is the rate at which the precessing nuclei (which are phase-aligned by the perturbing field) lose their phase alignments with each other. The relaxation time constant of this coherence loss is the "spin-spin" or "transverse" relaxation time constant $T_2$.

Most commonly, NMR tool measurements are obtained using an RF pulse sequence known in the art as the Carr-Purcell-Meiboom-Gill ("CPMG") pulse sequence, and measuring the detectable "echo" signals generated by the precessing nuclei. The CPMG pulse sequence is most frequently used for measuring $T_2$ distributions, but a popular method for measuring $T_1$ distribution operates by observing the effect of different recovery time spacings between CPMG experiments. Other NMR tool methods employ consecutively spaced RF perturbations followed by a CPMG sequence to probe the magnetization build up. As is well known in the industry, either the $T_2$ or $T_1$ relaxation time distribution information can be readily converted into measurements of porosity (i.e., the volume fraction of void space in the formation), hydrocarbon saturation (i.e., the relative percentage of hydrocarbons and water in the formation fluid), and permeability (i.e., the ability of formation fluid to flow from the formation into the well bore). For a more comprehensive overview of the NMR technology including logging methods and various tool designs, the interested reader is directed, for example, to the book by Coates et al. entitled "NMR Logging: Principles and Applications" distributed by Gulf Publishing Company (2000), and hereby incorporated herein by reference for background. Additional description of NMR logging techniques is provided, for example, in U.S. Pat. Nos. 4,710,713; 4,717,876; 4,717,877; 4,939,648; 5,055,787; 5,280,243; 5,309,098; 5,517,115, 5,557,200; 5,696,448; 5,936,405; 6,005,389; 6,023,164; 6,107,796; 6,111,408; 6,242,913; 6,255,819; 6,512,371; 6,525,534; 6,541,969; 6,577,125; 6,583,621, 6,646,437; 6,717,404; and 7,463,027 which are hereby incorporated herein by reference.

Traditionally, NMR tools have a relatively large sensing region but also suffer from significant energy losses when employed in large boreholes with conductive fluids. The relatively large distance between the tool and the sensing region essentially offsets whatever gains the tool achieves through the use of a larger sensing volume, necessitating that the tool be custom designed for use in a relatively small range of borehole sizes.

DESCRIPTION OF THE DRAWINGS

Accordingly, there are disclosed in the drawings and the following description specific embodiments of a nuclear magnetic resonance ("NMR") tool having multiple pad-mounted atomic magnetometers. In the drawings:

FIG. 1 shows an illustrative environment for logging while drilling ("LWD").

FIG. 2 shows an illustrative environment for wireline logging.

Figure 3A:
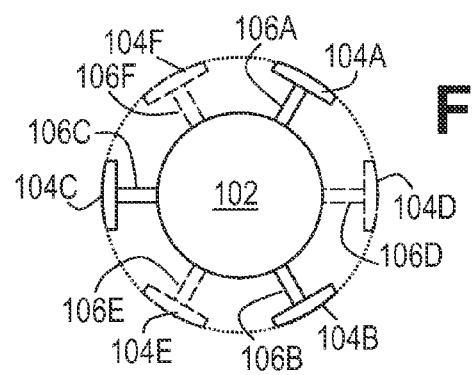
FIGS. 3A-3B show an illustrative multi-pad NMR logging tool.

It should be understood, however, that the specific embodiments given in the drawings and detailed description thereto do not limit the disclosure, but on the contrary, they provide the foundation for one of ordinary skill to discern the alternative forms, equivalents, and modifications that are encompassed with the given embodiments by the scope of the appended claims

DETAILED DESCRIPTION

The disclosed systems and methods are best understood in an illustrative context such as one of the downhole logging environments described here with reference to FIGS. 1-2. FIG. 1 shows an illustrative logging while drilling (LWD) environment. A drilling platform 2 supports a derrick 4 having a traveling block 6 for raising and lowering a drill string 8. A top drive 10 supports and rotates the drill string 8 as the string is lowered through a well head 12. The drill string's rotation (and/or a downhole motor) drives a drill bit 14 to extend the borehole 16. Mud recirculation equipment 18 draws drilling fluid from a retention pit 20 and pumps it through a feed pipe 22 to top drive 10, through the interior of drill string 8 to the drill bit 14, through orifices in drill bit, through the annulus around drill string 8 to a blowout preventer at the surface, and through a discharge pipe into the pit 20. The drilling fluid transports cuttings from the borehole into the pit 20 and aids in maintaining the borehole integrity.

An NMR tool 24 is integrated into the bottom-hole assembly ("BHA") near the bit 14. As the bit extends the borehole through the formations, the NMR tool 24 collects measurements relating to spin relaxation time distributions as a function of azimuth and position in the borehole. Sensing surfaces on stabilizers 25, pads, or non-rotating collars, are kept in contact or close proximity to the borehole wall as explained further below. Other tools and sensors can also be included in the BHA to gather measurements of various drilling parameters such as BHA position, orientation, weight-on-bit, borehole diameter, etc. The NMR logging tool 26 may take the form of a drill collar, i.e., a thick-walled tubular that provides weight and rigidity to aid the drilling process. Control/telemetry module 26 collects data from the various bottomhole assembly instruments (including position and orientation information) and stores them in internal memory. Selected portions of the data can be communicated to surface receivers 28 by, e.g., mud pulse telemetry. Other logging-while drilling telemetry methods also exist and could be employed. For example, electromagnetic telemetry or through-wall acoustic telemetry can be employed with an optional repeater 30 to extend the telemetry range. Most telemetry systems also enable commands to be communicated from the surface to the control and telemetry module to configure the operation of the tools.

For mud pulse telemetry, telemetry module 26 modulates a resistance to drilling fluid flow to generate pressure pulses that propagate to the surface. One or more pressure transducers 28 convert the pressure signal into electrical signal(s) for sampling and digitization by a data acquisition system 36, which then communicates the digital data to a computer system 50 or some other form of a data processing device. Computer 50 operates to process and decode the received signals in accordance with software (which may be stored on information storage media 52) and user input received via an input device 54. The resulting telemetry data may be further analyzed and processed by computer 50 to generate a display of useful information on a computer monitor 56 or some other form of a display device. For example, a driller could employ this system to measure NMR-related properties of selected formations.

At various times during the drilling process, the drill string 8 may be removed from the borehole as shown in FIG. 2. Once the drill string has been removed, logging operations can be conducted using a wireline logging tool 34, i.e., a sensing instrument sonde suspended by a cable 42 having conductors for transporting power to the tool and telemetry from the tool to the surface. The wireline logging tool 34 has pads 36 that maintain the tool near the axis of the borehole as the tool is pulled uphole. Tool 34 includes an NMR logging tool having multiple pad-mounted magnetometers that collect relaxation time distribution measurements and may further include instruments for measuring tool position and orientation. A logging facility 44 collects measurements from the logging tool 34, and includes a computer system for processing and storing the measurements gathered by the logging tools. Tubing-conveyed logging is similar to wireline logging, except that a tubing string is used to move the instrument sonde/NMR logging tool through the borehole.

Figure 3B:
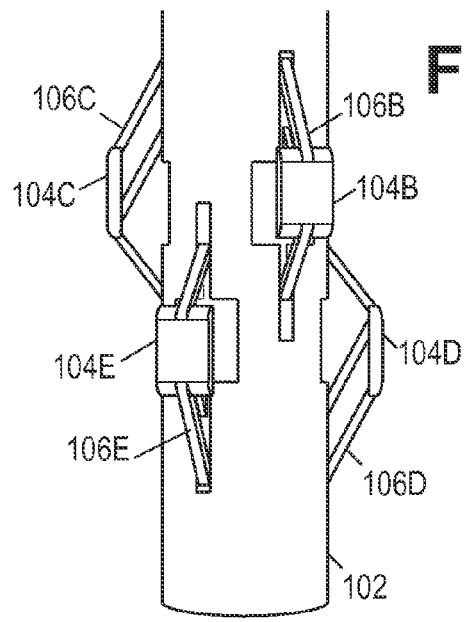

FIG. 3A is a cross-sectional view showing a angular distribution of pads for an illustrative NMR logging tool 102, while FIG. 3B shows a side view of the illustrative tool. The illustrative tool has six pads 104a-104f, each supported by a corresponding arm 106a-106f extending from the central body of the tool 102. The tool may have any number of pads equal to or greater than two, evenly distributed to maintain the central body of the tool near the borehole axis. The number of pads may vary based on the size of the pad and the comparative size of the borehole. In some embodiments, all of the pads are aligned on the same circumference of the tool. Alternatively, as shown in FIG. 3B, the pads may be split into multiple sets, each set being aligned on a different tool circumference. Pads 104a-104c are aligned on a first tool circumference, while pads 104d-104f are aligned on a second circumference. Typically, each set would consist of 2, 3, or 4, pads, and would be angularly offset from each of the other sets to provide more complete coverage of the borehole wall.

In some embodiments, each pad is equipped with permanent magnets to establish the static magnetic field $B_0$ employing, for example, a bar magnet mouse design akin to that disclosed in Blumich, et al. "Simple NMR-MOUSE with a Bar Magnet", Concepts in Magnetic Resonance, 15(4) pp. 255-261 (2002). Other permanent magnet arrangements for NMR measurements are known and can be used, including unilateral magnets, barrel magnets, U-shaped magnets, etc. In other embodiments, the static field $B_0$ is established by permanent magnets in the central tool body, e.g., by two axially-polarized permanent magnets having like magnetic poles oriented towards each other. Iron poles on the outer ends of such magnets can be used to lengthen the static field lines while an iron yoke between the permanent magnets can be employed to shape the field lines in the measurement region.

The permanent magnet assemblies employed by the illustrative tool 102 may be designed to create a magnetic field strength corresponding to a proton NMR resonance frequency in the range of $10^4$ Hz. (The currently available NMR logging instruments typically operate at $10^5$-$10^6$ Hz.) The size of the required magnets for this lower resonance frequency should be less than a tenth of the magnets employed in currently available pad logging tools since the resonance frequency is proportional to the magnetic field. Pad mounted magnets can be comparatively small and light.

While the central tool body can be equipped with radio frequency antenna(s) for generating the perturbing magnetic field $B_1$, it may be preferred that each pad be equipped with its own antenna(s) for generating a localized perturbing field $B_1$. Such an arrangement is expected to reduce energy requirements, particularly in boreholes having conductive fluids. The number of pads may be chosen to provide maximum coverage of the borehole surface while avoiding perturbing field B1 interference from neighboring when the arms are extended. Since the tool is designed primarily for porosity and/or bound water logging, it is not required to have a strictly uniform field throughout the sensitive volume.

Figure 4:
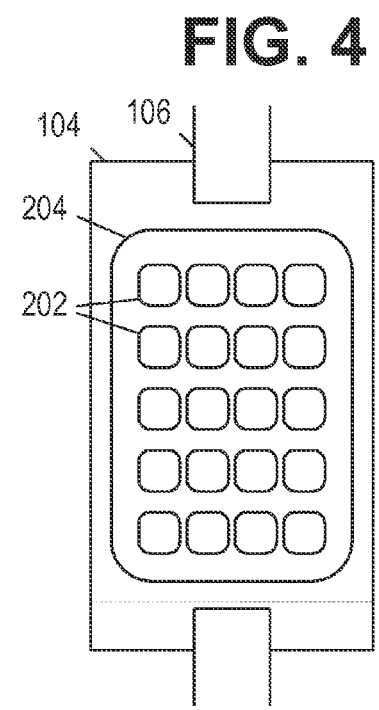
FIG. 4 shows an illustration of an array of pad-mounted atomic magnetometers.

The pads 104a-104f are each equipped with an array of atomic magnetometer cells 202 as indicated in FIG. 4, and may further be equipped with a coil antenna 204 for generating the perturbing field B1. The atomic magnetometer cells 202 operate as individual NMR receivers to map the variation of the NMR response across various locations in the geometry, thereby preserving spatial information for further processing. The magnetometer cells may each provide vector field measurements, e.g., by measuring the magnetic field's x, y, and z components. Moreover, the mapping of magnetic field gradient to frequency and/or phase can also be employed to preserve the spatial information. That is, some tool embodiments map the spatial variation of NMR signal responses by using an array of RF atomic magnetometers that are tuned into different RF frequencies, such as the type of RF atomic magnetometers described in Savukov et al., *Detection of NMR Signals with a Radio-frequency Atomic Magnetometer, J. Magn. Reson.*, v. 185, pp. 214-220 (2007). These RF atomic magnetometers can detect magnetic fields at any frequency in the kHz to MHz range. Other RF atomic magnetometers operating in the same principle may also be utilized.

In one particular tool embodiment, the array of RF atomic magnetometers is tuned to a series of different frequencies. A permanent magnet assembly is mounted on the pad to generate a static magnetic field, $B_0(\tau)$ having a gradient that decreases monotonically as the distance from the borehole wall is increased. The frequencies of the RF atomic magnetometers are tuned to provide measurements from substantially equally distanced depth of investigation intervals. The extension of the arms may be supported by springs to ensure that for any borehole size, the pads are always touching the borehole surface, thereby providing an almost constant signal-to-noise ratio independent of the borehole size.

The plurality of pads, particularly if equipped with individual magnet assemblies and RF coils, provide several potential advantages. The proximity between the measurement region and the magnets and sensors enables the tool to employ much smaller magnet assembly while being adaptable to a whole range of borehole sizes with an essentially constant depth of investigation. The detrimental effects normally caused by a conductive borehole fluid are significantly reduced, as are the power requirements for the RF coils. The loss of signal to noise ratio that typically results from a loss of measurement volume can be at least partly compensated by stacking multiple measurements (which in some instances may require a reduced logging speed).

The atomic magnetometers employed as NMR sensors by the illustrative tool 102 replace the "traditional" induction surface coil. An atomic magnetometer can have high sensitivity at low frequencies, enabling the tool to employ a weaker static field $B_0$. (The resonance frequency is proportional to the static field strength.) Savukov et al., *Tunable Atomic Magnetometer for Detection of Radio-Frequency Magnetic Fields, Phys Rev Lett.*, v. 95, 063004 (2005), the entire content of which is hereby incorporated by reference herein, derives the fundamental sensitivity limits for an atomic magnetometer as:

$$\delta B_{am,min} = \frac{2}{\gamma} \sqrt{\frac{\bar{v}[\sigma_{ex}\sigma_{sd}/5]^{1/2}}{V_a}} \left(1 + \frac{1}{4\sqrt{\eta}}\right) \quad (1)$$

for alkali atoms with nuclear spin I=3/2 (such as $^{39}$K) and for resonance frequencies below 1 MHz. In equation (1), $\bar{v}$ is the mean relative thermal velocity of alkali metal collisions. $\sigma_{ex}$ and $\sigma_{sd}$ are the spin-exchange and spin destruction collision cross-sections for alkali metals. $\eta$ is the quantum efficiency of the photo-detectors, and $V_\alpha$ is the active volume of the atomic magnetometer, defined as the volume of the intersection of the optical pump and probe beams where the atomic spins are both polarized and interrogated. For photodiode efficiency $\eta$=80%, the total noise of the magnetometer is close to the spin projection noise. For a sensor cell dimension of 4" (Height)×1.5" (Width)×0.25" (Thickness) on a pad, the active volume is approximately $V_\alpha$=25 cm³ per cell, the magnetic field sensitivity for K vapor is approximately equal to 0.02 fT/√Hz.

By contrast, the ideal sensitivity of a commonly used inductive pickup coil is limited by Johnson noise $$\delta B_{ind,min} = \frac{8}{\omega D} \sqrt{\frac{k_B T \rho}{V_w}} \quad (2)$$

where $\rho$ is the resistivity of the wire material, $k_B$ is the Boltzmann constant, and T is the absolute temperature for a surface coil with a mean diameter of D and the resonance frequency is $\omega$. See Savukov et al., *Detection of NMR Signals with a Radio-frequency Atomic Magnetometer, J. Magn. Reson.*, v. 185, pp. 214-220 (2007), the entire content of which is hereby incorporated by reference herein. This will yield the fundamental sensitivity limit at low frequencies approximately 3 orders of magnitude poorer than that of an alkali metal atomic magnetometer.

One contemplated tool embodiment employs the Earth's magnetic field as the static field $B_0$ to polarize the protons in the formation. No extra static magnetic field is required, which obviates the permanent magnet assemblies and consequently reduces the cost of the tool as well as the length and weight of the pads and the tool. Since the Earth's magnetic field is always there and substantially stable in the drilling and logging job time interval (i.e., hours or days), it requires no pre-polarization as the reservoir spins are always polarized along the Earth's magnetic field direction before the measurements are conducted. This enables measurements of not just fast-relaxing fluid components (e.g., bound water volume), but also formation fluids having long relaxation times such as light hydrocarbon and fluids in large-size pores where the longitudinal relaxation time can be as long as several seconds. Thus the tool can obtain the total porosity and movable fluid volume in addition to the bound water volume, measurements that would otherwise be infeasible due to a requirement for a very slow logging speed and/or a long pre-polarizing magnet to adequately pre-polarize the atomic spins before the measurement.

In certain embodiments, the atomic magnetometer is scalar, i.e., only measures total magnitude of a magnetic field. This has the advantage in that the device is less sensitive to the orientation of the sensor with respect to the magnetic field. In other embodiments, the atomic magnetometer is vector, i.e., it measures the Cartesian components of the magnetic field.

Returning to a discussion of the tool geometry, we note that the circumference of the borehole is $c=\pi d$ where d is the borehole diameter. If the number of pads is fixed for all borehole sizes, one does not take advantage of the large surface area available for measurements. Accordingly, some tool embodiments may vary the number of pads deployed based on the size of the borehole. For example, the illustrative tool 102 may deploy only one set of pads (e.g., 104a-104c in FIG. 3B) in small boreholes to avoid interference between neighboring pads, while in larger diameter boreholes the tool may deploy both sets of pads to acquire measurements over a larger surface area.

Figure 5:
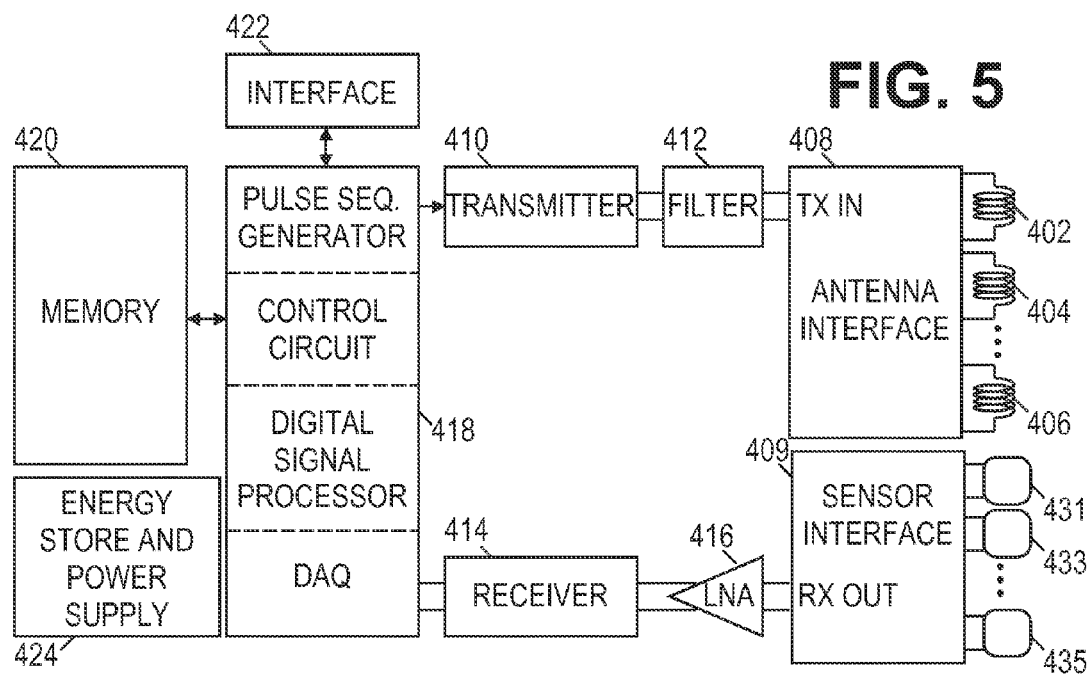
FIG. 5 is a block diagram for an illustrative NMR tool.

FIG. 5 is a block diagram of an illustrative NMR logging tool. An antenna interface 408 makes each of multiple antennas 402-406 individually selectable for operation as a transmitting antenna, while a sensor interface 409 makes each of multiple atomic magnetometers 431-435 individually selectable as an active sensor. The number of transmitting antennas does not necessary equal the number of receiver sensors. For instance, for a pad with array of cells, one transmitting antenna may generate $B_1$ in a larger region while the array of receiver sensors each measures the signal in a localized subregion. A RF transmitter 410 is coupled to the antenna interface 408 via a filter 412 to provide a RF pulse to a selected one or multiple antenna(s) during a perturbation phase, while a receiver 414 is coupled to the sensor interface 409 via a low-noise amplifier (LNA) 416 to detect echo signals during a measurement phase. The filter 412 shapes the RF pulses. The receiver 414 demodulates the output from the preamplifier LNA. DSP 418 coordinates operation of the tool in accordance with software or firmware stored in memory 420 and in response to commands and configuration parameters received via telemetry interface 422. Acquired data are stored in memory 420 for retrieval when the tool returns to the surface. Some or all of the data may optionally be transmitted to the surface equipment via telemetry interface 422 during the logging process. Often the DSP 418 will provide at least some processing of the measurements downhole to, e.g., reduce the requirements for data storage and transmission speed.

The tool further includes a power supply 424 for regulating and conditioning power to be delivered to the rest of the tool's electronic components. The source of the power may be downhole batteries, a fluid-driven generator, or electrical current provided from the surface via a wireline. To address the transmitter's need for sudden bursts of power, the power supply 424 may include an energy storage unit which can be charged slowly to limit power demand, yet can release the sudden bursts of high current to drive the transmitter.

Figure 6:
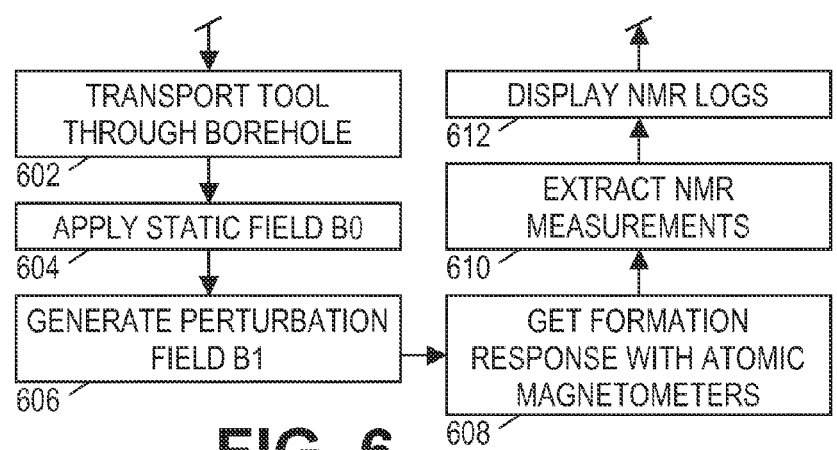
FIG. 6 is a flow diagram of an illustrative NMR logging method.

FIG. 6 is a flowchart of an illustrative NMR logging method. The method begins in block 602 with the transport of a wireline or LWD tool along a borehole. Stabilizers or arm-supported pads keep sensing surfaces in contact or close proximity to the borehole wall during the NMR logging process. In block 604, the formation nuclei are polarized with a static magnetic field ($B_0$). The tool itself can provide the static field using permanent magnet assemblies behind the sensing surfaces, or it may rely on the Earth's magnetic field as the static field. In block 606, transmit antennas on the sensing surfaces generate a perturbation field ($B_1$), e.g., using a sequence of pulses to generate a series of echoes from which a distribution of relaxation time constants can be extracted. In block 608, an array of atomic magnetometers in each sensing captures the echo signals as a function of spatial position, and in block 610, the tool processes the measurements to extract the relaxation time constants as a function of tool position and spatial relationship to the sensing surface. From the extracted information, the tool or the surface electronics can extract various desired formation parameters including, e.g., bound water volume. Where the tool orientation is tracked, the measurements can be mapped as a function of tool position and sensor orientation to provide an image log of the borehole wall. Whatever form the NMR log takes, it can be displayed to a user as indicated in block 612.

Numerous other modifications, equivalents, and alternatives, will become apparent to those skilled in the art once the above disclosure is fully appreciated. For example, the tool may acquire measurements as a function of time while other instruments track tool position and orientation as a function of time to enable a post-logging association of acquired measurements with tool position. Though primarily directed at a wireline logging tool embodiment, the teachings provided herein are also applicable to a LWD tool embodiment though it would be desirable to make the pads stationary during measurements, e.g., through the use of a sleeve that enables the drillstring to rotate without turning the NMR logging assembly. It is intended that the following claims be interpreted to embrace all such modifications, equivalents, and alternatives where applicable.

What is claimed is:

1. A nuclear magnetic resonance (NMR) logging tool that comprises:
 a central tool body that moves along a borehole through a formation;
 at least two sensing surfaces angularly offset from each other and arranged around a periphery of the central tool body to contact a wall of the borehole, wherein each sensing surface includes at least one atomic magnetometer that measures the formation's response to application of a perturbation magnetic field ($B_1$) in the presence of a static magnetic field ($B_0$), and wherein each sensing surface is equipped with a transmit antenna that applies the perturbation magnetic field ($B_1$); and
 processing electronics coupled to the atomic magnetometers to measure formation responses and derive NMR measurement logs.

2. The tool of claim 1, wherein each sensing surface is backed by a permanent magnet assembly that applies the static magnetic field ($B_0$) to the formation.

3. The tool of claim 2, wherein each sensing surface is on a wall-contacting face of an extensible arm-mounted pad.

4. The tool of claim 3, wherein each extensible arm-mounted pad includes a respective permanent magnet assembly.

5. The tool of claim 3, wherein the pads around the periphery of the tool are all aligned on one tool circumference.

6. The tool of claim 3, wherein at least one of the pads around the periphery of the tool is aligned on a different tool circumference than another of the pads.

7. The tool of claim 3, wherein the pads are arranged in a first set and a second set, said first set of pads being mounted on the tool in close proximity to said second set of pads but angularly offset from the second set, wherein each set of pads is extensible to contact the borehole wall when in use and is retractable when not in use.

8. The tool of claim 7, wherein the tool logs with only one of the two sets for boreholes smaller than a predetermined diameter and logs with both of the two sets for boreholes larger than the predetermined diameter.

9. The tool of claim 1, wherein the static magnetic field ($B_0$) provides a proton resonance frequency below about $10^5$ Hz.

10. The tool of claim 1, wherein the at least one atomic magnetometer is a radio-frequency atomic magnetometer.

11. The tool of claim 1, wherein each sensing surface includes an array of atomic magnetometers, each atomic magnetometer acting as an individual formation response receiver.

12. The tool of claim 11, wherein the processing electronics determines a spatial relationship of the formation responses.

13. The tool of claim 11, wherein the atomic magnetometers are radio-frequency atomic magnetometers tuned to a plurality of different frequencies.

14. The tool of claim 13, further comprising a permanent magnet assembly on each pad, the permanent magnet assembly providing a static magnetic field gradient that decreases monotonically as the distance from a formation borehole wall is increased, wherein the frequencies of the radio-frequency atomic magnetometers provide equally-spaced depths of investigation.

15. A nuclear magnetic resonance (NMR) logging method that comprises:
  transporting a tool along a borehole through a formation, the tool having a plurality of sensing surfaces angularly offset from each other and arranged around the periphery of a central tool body to contact a wall of the borehole, each sensing surface having at least one atomic magnetometer;
  applying a perturbing field (B1) for each sensing surface with a coil antenna that surrounds its respective sensing surface;
  measuring with each atomic magnetometer a formation response to the perturbing field (B1) in the presence of a static field (B0); and
  processing the formation responses to derive NMR measurement logs.

16. The method of claim 15, further comprising providing the static field for each sensing surface with a permanent magnet assembly that backs the sensing surface.

17. The method of claim 16, further comprising extending arm-mounted pads before said providing, applying, and measuring operations, each pad having one of said sensing surfaces.

18. The method of claim 17, wherein each arm-mounted pad includes a respective permanent magnet assembly.

19. The method of claim 15, wherein the static field provides a proton resonance frequency below about $10^5$ Hz.

20. The method of claim 15, wherein each sensing surface includes an array of atomic magnetometers, each atomic magnetometer acting as an individual formation response receiver, and wherein said processing includes determining the formation responses as a function of depth of investigation.

21. The method of claim 15, wherein each sensing surface includes an array of atomic magnetometers, each atomic magnetometer acting as an individual formation response receiver.

22. The tool of claim 21, wherein the atomic magnetometers are radio-frequency atomic magnetometers tuned to a plurality of different frequencies.

* * * * *